US007252922B2

(12) United States Patent
Aoshima et al.

(10) Patent No.: US 7,252,922 B2
(45) **Date of Patent: *Aug. 7, 2007**

(54) IMAGE RECORDING MATERIAL

(75) Inventors: Keitaro Aoshima, Shizuoka-ken (JP); Kei Kikuchi, Shizuoka-ken (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 700 days.

This patent is subject to a terminal disclaimer.

(21) Appl. No.: 10/101,695

(22) Filed: Mar. 21, 2002

(65) Prior Publication Data

US 2003/0008228 A1 Jan. 9, 2003

(30) Foreign Application Priority Data

Mar. 29, 2001 (JP) ............................ 2001-097299

(51) Int. Cl.
*G03F 7/021* (2006.01)
*G03F 7/031* (2006.01)

(52) U.S. Cl. ................ 430/162; 430/281.1; 430/287.1; 430/288.1; 430/302

(58) Field of Classification Search ................ 430/162, 430/270.1, 271.1, 281.1, 302, 287.1, 288.1
See application file for complete search history.

(56) References Cited

U.S. PATENT DOCUMENTS

| | | | | |
|---|---|---|---|---|
| 4,971,891 | A * | 11/1990 | Kawamura et al. | 430/278.1 |
| 5,658,708 | A | 8/1997 | Kondo | |
| 5,807,659 | A * | 9/1998 | Nishimiya et al. | 430/302 |
| 6,013,412 | A | 1/2000 | Aoshima | |
| 6,309,792 | B1 | 10/2001 | Hauck et al. | |
| 6,346,365 | B1 * | 2/2002 | Kawauchi et al. | 430/302 |
| 6,476,092 | B1 * | 11/2002 | Kunita | 522/31 |
| 6,566,035 | B1 * | 5/2003 | Aoshima | 430/270.1 |
| 6,838,222 | B2 * | 1/2005 | Aoshima et al. | 430/176 |
| 2002/0177074 | A1 * | 11/2002 | Hoshi et al. | 430/281.1 |

FOREIGN PATENT DOCUMENTS

| | | | |
|---|---|---|---|
| EP | 0 438 123 | B1 | 7/1991 |
| EP | 0 784 233 | A1 | 7/1997 |
| EP | 0 949 539 | A2 | 10/1999 |
| EP | 1 072 955 | A2 | 1/2001 |
| JP | 7-103171 | A | 4/1995 |
| JP | 8-108621 | A | 4/1996 |
| JP | 9-34110 | A | 2/1997 |
| WO | WO 00/48836 | | 8/2000 |

OTHER PUBLICATIONS

English Abstract of JP 2000-267292A published Sep. 29, 2000.

* cited by examiner

*Primary Examiner*—John S. Chu
(74) *Attorney, Agent, or Firm*—Buchanan Ingersoll & Rooney PC

(57) ABSTRACT

A negative-type image recording material comprising a support having a rear surface and an image recording layer disposed on the support, the image recording layer having a front surface and including (A) a radical-generating agent and (B) a radically polymerizable compound, wherein a static friction coefficient between the front surface and the rear surface is less than 0.50. In order to achieve such a specified static friction coefficient, it is preferable that the image recording layer contains (D) a compound represented by the following formula (1):

$$R^1—X \quad (1)$$

wherein $R^1$ represents an optionally substituted hydrocarbon group having a total of 8 to 32 carbon atoms, and X represents CO—Y—$R^2$, NH—CO—NH—$R^2$, $SO_2$—Y—$R^2$, or Y—$R^3$ in which Y represents O, S, $NR^4$ or a single bond.

9 Claims, No Drawings

IMAGE RECORDING MATERIAL

BACKGROUND OF THE INVENTION

1. Field of the Invention

The present invention relates to a planographic printing plate precursor that has sensitivity to a UV ray, a visible ray, or an infrared ray. More specifically, the present invention relates to a so-called negative-type image recording material capable of directly plate-making by using a laser from a digital signal of a computer or the like.

2. Description of the Related Art

Due to the latest noticeable development of lasers, lasers which are capable of outputting high-power in any of a UV region, a visible region and an infrared region and made compact have been easily made available. Such laser are very useful as recording light sources in directly plate-making on the basis of digital data of a computer or the like ('Computer to Plate' which is abbreviated as 'CTP' hereinafter). A solid-state laser and a semiconductor laser which emit an infrared ray having a wavelength of 760 nm to 1200 nm are extremely useful because these lasers can output higher power than the lasers having other wavelength regions. Accordingly, in these years, a demand for such an image recording material which is highly sensitive to an infrared laser, i.e., an image recording material whose solubility in a developer varies largely when exposed with an infrared laser has increased.

Ordinarily, a plurality of planographic printing plate precursors are stacked, stored and conveyed. During this process, the front surface of the image recording layer are stuck to the rear surface of the support. In the negative-type image recording layer that is cured by light exposure, strength of the image recording layer prior to curing via cross-linking or polymerization is relatively low. Meanwhile, in the negative-type image recording layer that includes a low molecular polymerizable compound, the support and the image recording layer are easily stuck to each other. In both cases, a problem arises that, when the stack of the materials is dislocated or when the stacked materials are conveyed sequentially one plate after another from the top for processing, the image recording layers are likely to suffer scratches due to rubbing.

In a general purpose image writing method using visible light, an image forming reaction is effected by using light both in laser exposure and in lamp exposure to allow sufficient optical reaction to occur at a deeper portion in the image recording layer, i.e., in the vicinity of the support. Therefore, partly missing of the image of at an image area of the image recording layer (hereinafter, "image missing") does not occur even when only the front surface of the image recording layer receives scratches. Accordingly, image defects such as image missing occurs only when scratches are serious enough to reach the deepest portion of the image recording layer.

In another image writing method using an infrared laser as conducted by the present invention, an infrared ray is converted to heat to cause a temperature rise in the image recording layer, whereby an image is formed. In this method, when a support in general use, such as aluminum is employed, heat diffuses into the support which has high thermal conductivity. Therefore, a sufficient temperature rise is not achieved at the deeper portion of the image recording layer, while a sufficient temperature rise to cause an efficient thermal reaction is obtained at the portions in the vicinity of the front surface of the image recording. In such an image forming mechanism, even if only the front surface of the image recording layer receives a slight scratch, curing reaction takes place, and defects are produced at a region to effect curing reaction near the front surface, which is also a region resistant to a developer, whereby image-missing is likely to occur. Accordingly, in the image recording method using an infrared ray as conducted by the present invention, an image forming material is more easily affected by such scratches to noticeably impair image quality than in the image recording method using a visible light.

The present inventors conducted extensive researches and clarified that a problem arises that rubbed portions remain as a residual layer at non-image areas of the image recording layer after completion of a development processing. This is presumably attributed to the facts that, when the front surface of the image recording layer and the rear surface of the support are rubbed together to create frictional heat, a radically polymerizable compound present in the image recording layer undergoes polymerization by the frictional heat, and cured portions of the image recording layer cannot be removed after the development, resulting in a residual layer produced at non-image areas.

Such a phenomenon is noticeable in the negative-type image recording material containing a light absorbent such as an infrared ray absorbent. It is supposed that, since the image recording layer has a mechanism by which an infrared ray is converted to heat to cause an image forming reaction, the image recording layer is more sensitive to heat created by friction, whereby the residual layer is more likely produced than that having another image forming mechanism.

In order to prevent the image recording layer from suffering scratches or prevent the residual layer from being produced at non-image areas of the image recording layer, it is designed to interpose protective paper (interleaf sheets) between stacked layers of the planographic printing plate precursors. However, when continuous plate-making of the planographic printing plate precursors is carried out, operations of peeling the interleaf sheets from the planographic printing plate precursors are required, to thus impair working efficiency.

Specifically in the aforementioned CTP outputting system, it is highly desired to reduce the cost of a device and increase the number of exposure plates per unit time. For this reason, it is useful to obviate a mechanism to remove interleaf sheets from a plate material feeder in the outputting system in order to simplify the device. That is, it is desired to feed materials in the form of non-interleaf sheets, and convey the same inside the outputting device.

Thus, there is a strong demand for a negative-type image recording material which is free from scratches or residual layer production even when the image recording materials are stacked and conveyed without interleaf sheets interposed therebetween.

SUMMARY OF THE INVENTION

The present invention was accomplished in consideration of the aforementioned problems. It is an object of the present invention to provide a negative-type image recording material with which images can be recorded using a CTP outputting system, especially using a solid-state laser and a semiconductor laser which emit an infrared ray in accordance with digital data from a computer or the like, and by which the stacked image recording layers can be stored without interposing interleaf sheets therebetween and undesirable residual layers at non-image areas of each image recording layer can be prevented from being produced even when fed to an image forming device, whereby high-quality images can be obtained.

The present inventors found, from an intensive research on the physical properties of negative-type planographic printing plate precursors exerted when they are stacked, that the above object can be achieved by controlling a static friction coefficient between a front surface of the image recording layer of the negative-type image recording material and a rear surface of a support to a predetermined range of a value.

A first aspect of the present invention is a negative-type image recording material comprising a support having a rear surface and an image recording layer disposed on the support, the image recording layer having a front surface and including (A) a radical-generating agent and (B) a radically polymerizable compound, the front surface and the rear surface being disposed at opposite sides of the image recording material, wherein, if the front surface of a portion of the image recording material is in contact with the rear surface of a portion of the image recording material, a static friction coefficient between the front surface and the rear surface is less than 0.50.

A second aspect of the present invention is a negative-type image recording material comprising a support having a rear surface and an image recording layer disposed on the support, the image recording layer having a front surface and including (A) a radical-generating agent, (B) a radically polymerizable compound, and (C) a light absorbent, the front surface and the rear surface being disposed at opposite sides of the image recording material, wherein, if the front surface of a portion of the image recording material is in contact with the rear surface of a portion of the image recording material, a static friction coefficient between the front surface and the rear surface is less than 0.50.

A third aspect of the present invention is a negative-type image recording material comprising a support having a rear surface and an image recording layer disposed on the support, the image recording layer having a front surface and including (A) a radical-generating agent, (B) a radically polymerizable compound and (D) a compound represented by the following formula (1):

$$R^1—X \qquad (1)$$

wherein $R^1$ represents an optionally substituted hydrocarbon group having a total of 8 to 32 carbon atoms; and X represents CO—Y—$R^2$, Y—CO—$R^2$, NH—CO—Y—$R^2$, O—CO—NH—$R^2$, NH—CO—NH—$R^2$, $SO_2$—Y—$R^2$, Y—$SO_2$—$R^2$, O—$SO_2$—$R^2$, CO—O—CO—$R^2$, or Y—$R^3$ in which Y represents O, S, $NR^4$ or a single bond, with a proviso that if X is Y—$R^3$, then Y is not a single bond; and each of $R^2$, $R^3$ and $R^4$ independently represents a hydrogen atom or an optionally substituted hydrocarbon group having a total of 20 or less carbon atoms.

In the negative-type planographic printing plate precursors of the present invention, since the static frictional coefficient between the front surface of the image recording layer and the rear surface of the support is controlled to a value of less than 0.50, surface energy is low enough to prevent heat generation due to friction which occurs among the planographic printing plate precursors kept in contact with one another during conveyance. Consequently, the image recording layer can effectively be prevented from being cured by a frictional heat generated among the stacked materials and from causing a residual layer at non-image areas.

As one of the embodiments to control the static frictional coefficient, a means is proposed in the method of the present invention by which the compound represented by the aforementioned formula (1) is contained in the image recording layer. There is understood that, when such a compound is included in a coating solution for an image recording layer, the compound diffuses into the surface of the image recording layer during coating and drying the coating solution and functions to decrease the static frictional coefficient, whereby the residual layer is effectively prevented from being produced.

DESCRIPTION OF THE PREFERRED EMBODIMENTS

The present invention will be described in more detail hereinafter.

A negative-type image recording material of the present invention comprises a support having a rear surface and an image recording layer disposed on the support and having a front surface, wherein a static friction coefficient between the front surface of the image recording layer and the rear surface of the support is controlled to be less than 0.50.

A method of measuring the static friction coefficient is conducted by conventionally measuring method. However, the present invention adopts values of the static friction coefficient measured by using a HEIDON static frictional angle meter (manufactured by Shintoh Kagaku Co., Ltd.) under the conditions of a temperature of 25° C. and a humidity of 50%.

Methods for controlling the static frictional coefficient between the front surface of the image recording layer and the rear surface of the support to below 0.50 are not particularly limited, and examples thereof can include a method of providing on the front surface of the image recording layer an overcoat layer having a surface energy low enough not to affect recording sensitivity; a method of incorporating a compound capable of reducing a frictional coefficient of the surface as a constituent in the image recording layer at localized portions of the surface; and a method of forming a back-coat layer having low surface energy on the rear surface of the support.

Among these methods, the method of incorporating the compound capable of reducing the frictional coefficient of the surface as the constituent in the image recording layer is preferably used from the standpoint of facilitating the manufacturing process of planographic printing plate precursors without impairing image forming ability.

One embodiment of the methods of the present invention will be described hereinafter.

In this embodiment, the present invention uses an image recording layer including (A) a radical-generating agent, (B) a radically polymerizable compound, and (D) a compound represented by the following formula (1).

$$R^1—X \qquad (1)$$

wherein $R^1$ represents an optionally substituted hydrocarbon group having a total of 8 to 32 carbon atoms; and X represents CO—Y—$R^2$, Y—CO—$R^2$, NH—CO—Y—$R^2$, O—CO—NH—$R^2$, NH—CO—NH—$R^2$, $SO_2$—Y—$R^2$, Y—$SO_2$—$R^2$, O—$SO_2$—$R^2$, CO—O—CO—$R^2$, or Y—$R^3$ in which Y represents O, S, $NR^4$ or a single-bond, with a proviso that if X is Y—$R^3$, then Y is not a single-bond; and each of $R^2$, $R^3$ and $R^4$ independently represents an optionally substituted hydrocarbon group having 20 or less carbon atoms.

(D) Compounds Represented by Formula (1)

In formula (1), $R^1$ represents a hydrocarbon group having 8 to 32 carbon atoms. Specifically, it is preferable to use a hydrocarbon group having a substituent such as, a halogen group, a hydroxy group, a cyano group, and an amino group. Further, the hydrocarbon group may have an ether-bond, an ester-bond, or an amido-bond.

The total number of carbon atoms, including these substituents and the bonds, should be 8 to 32. The tendency shows that, when the total number of carbon atoms is less than 8, an effect to inhibit residual layer production at non-image areas of the image recording layer is impaired, while the total number of carbon atoms is more than 32, solubility of the image recording layer in a developer decreases.

Specific examples of preferable $R^1$ include linear alkyl groups such as a decyl group, a dodecyl group, a hexadecyl group, and an octadecyl group; branched alkyl groups such as 14-methylpentadecyl group and 16-methylheptadecyl group; an alkyl group having a double-bond such as 9-octadecenyl group; and an aryl group such as a nonylphenyl group.

In the above formula, X represents CO—Y—$R^2$, Y—CO—$R^2$, NH—CO—Y—$R^2$, O—CO—NH—$R^2$, NH—CO—NH—$R^2$, $SO_2$—Y—$R^2$, Y—$SO_2$—$R^2$, O—$SO_2$—$R^2$, CO—O—CO—$R^2$, or Y—$R^3$ in which Y represents O, S, $NR^4$ or a single-bond with a proviso that if X is Y—$R^3$, then Y is not a single-bond; and each of $R^2$, $R^3$ and $R^4$ independently represents a hydrogen atom or an optionally substituted hydrocarbon group having a total of 20 or less carbon atoms. Preferable examples of the substitutes which can be introduced include a halogen group, a hydroxy group, a cyano group, and an amino group.

The hydrocarbon group may contain an ether-bond, an ester-bond, and an amido-bond.

Preferable examples of $R^2$, $R^3$ and $R^4$ include a hydrogen atom, a hydrocarbon group such as a methyl group, an ethyl group, an n-butyl group, an i-butyl group, a sec-butyl group, a t-butyl group, a hexyl group, a phenyl group, a benzyl group, a naphthyl group, and a dodecyl group.

Preferable examples of the compound represented by formula (1) will be described below. However, the present invention is not limited thereto.

Examples of carboxylic acids (X is COOH in formula (1)) include an enanthic acid, a caprylic acid, a pelargonic acid, a capric acid, an undecylic acid, a lauric acid, a tridecylic acid, a myristic acid, a pentadecylic acid, a palmitic acid, a heptadecylic acid, a stearic acid, a nonadecanoic acid, an arachic acid, a behenic acid, a lignoceric acid, a cerotic acid, a heptacosanoic acid, a montanic acid, a melissic acid, a lacceric acid, an undecylenic acid, an oleic acid, an elaidic acid, a cetoleic acid, an erucic acid, and a brassidic acid.

Examples of esters of the carboxylic acid (X is COOH) exemplified above include carboxylic acid methyl ester, ethyl ester, propyl ester, butyl ester, dodecyl ester, phenyl ester, naphthyl ester, allyl ester, and (meth)acrylic acid dodecyl ester, hexadecyl ester, nonylphenyl ester, or 4-styrenecarboxylic acid dodecyl ester, hexadecyl ester and nonylphenyl ester.

Examples of thiocarboxylic acid esters (X is COSR) include methyl thioester, ethyl thioester, propyl thioester, butyl thioester, and benzyl thioester of the carboxylic acid exemplified above.

Examples of carboxylic acid amide (X is $CONH_2$ or CONHR) include: amide, methyl amide, ethyl amide and allyl amide of the above-exemplified carboxylic acid, and dodecyl amide hexadecyl amide, and hexadecyl anilide of (meth)acrylic acid or dodecyl amide hexadecyl amide, and hexadecyl anilide of 4-styrene carboxylic acid.

Examples of urethane and urea derivatives (X is O—CO—NH—R or NH—CO—NH—R) include a reaction product of octadecyl amine and 2-hydroxyethylacrylate, and a reaction product of 2-methacryloyloxyethylisocyanate and hexylamine.

Examples of alcohol (X is OH) include octyl phenol, nonyl phenol, dodecyl phenol, 1-docosanol, 1-hexenyl phenol, (2-methyl-1-heptenyl) phenol, (2-ethylhexyl)oxy phenol, dodecyloxy phenol, dodecanoyloxy phenol, oleoylamino phenol, dodecanoylamino phenol, 2-hexylcyclohexanole, N-octyl-2-hydroxyniacinamide, 1-S-octyl-β-D-thioglucopyranoside, sorbitanmonolaurate, and N-dodecanoyl-3-pyrolidinol.

Examples of sulfonic acid derivatives (X is $SO_2$—O—R or $SO_2$—NH—R) include dodecyl benzene sulfonic acid phenyl ester, and nonane sulfonic acid anilide.

Besides, lactone and lactam such as y-dodecanolactone or 1-dodecyl-2-pyrolidinone (X is CO—O—R or CO—NH—R), acidic cyclic anhydride such as 2-dodecen-1-yl succinic anhydride (X is CO—O—CO—R), and aldehyde such as 1-docosanal (X is CO—H) are mentioned.

Among these compounds, preferable are the compounds which are solid at room temperature from the standpoint of decreasing a sliding friction coefficient.

From the standpoint of improving layer properties of the image forming layer, more preferable are the compounds having a radically polymerizable functional group such as an allyl group, a (meth)acryloyl group and a styryl group.

The amount of the compound represented by formula (1) to be added is preferably 0.001 to 10 wt %, and more preferably 0.01 to 5 wt % relative to the solid content in the image recording layer. If the amount is less than 0.001 wt %, residual layer at the non-image area cannot be prevented from being produced. Further, if the amount is more than 10 wt %, there is a possibility that solubility of the image recording layer in the developer may decrease. Therefore, the amount outside the above range is not preferable.

The negative-type image recording layer of the present invention comprises: (A) a radical-generating agent (radical polymerization initiator), and (B) a radically polymerizable compound which is cured by causing radical polymerization by a radical produced from the radical-generating agent. Preferably, the negative-type image recording layer of the present invention additionally comprises (C) a light absorbent, and (E) a binder polymer. In particular, the negative-type image recording material of the present invention exerts a noticeable effect when (C) the light absorbent is an infrared ray absorbent. In a heated or exposed region of the image recording layer, (A) the radical polymerization initiator such as an onium salt decomposes by heat and generates a radical. (B) The radically polymerizable compound is chosen from the compounds which have at least one ethylenically unsaturated double-bond, more specifically, at least one, preferably at least two, terminal ethylenically unsaturated bonds. Chain polymerization reaction takes place to cause curing to thereby form an image area.

Additional components of the image recording layer will be described hereinafter.

(A) Radical-generating Agent

As the radical-generating agent suitably used for the present invention, onium salts are mentioned. Specific examples of the onium salt include iodonium salts, diazonium salts and sulfonium salts. These onium salts also function as an acid generating agent. Further, when used in combination with a radically polymerizable compound described later, the onium salts serve as a radical polymerization initiator. The onium salts suitably used in the present invention are those represented by the following formulae (2) to (4):

(2)

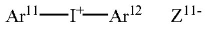

(3)

(4)

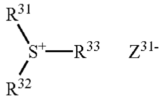

In formula (2), each of $Ar^{11}$ and $Ar^{2}$independently represents an optionally substituted aryl group having 20 or less carbon atoms. If the aryl group has substituents, preferable examples of substituents include a halogen atom, a nitro group, an alkyl group having 12 or less carbon atoms, an alkoxy group having 12 or less carbon atoms, or an aryloxy group having 12 or less carbon atoms. $Z^{11-}$ represents a counter ion selected from the group consisting of a halogen ion, a perchlorate ion, a tetrafluoroborate ion, a hexafluorophosphate ion, and a sulfonate ion, and preferable examples of the counter ion include the perchlorate ion, the hexafluorophosphate ion, and aryl sulfonic acid ion.

In formula (3), $Ar^{21}$ represents an optionally substituted aryl group having 20 or less carbon atoms. Preferable examples of the substituents include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, or a diarylamino group having 12 or less carbon atoms. $Z^{21-}$ represents a counter ion which is defined in a similar manner to $Z^{11-}$.

In formula (4), $R^{31}$, $R^{32}$ and $R^{33}$ may be the same or different from one another, and each represents an optionally substituted hydrocarbon group having 20 or less carbon atoms. Preferable examples of the substituents include a halogen atom, a nitro group, an alkyl group having 12 or less carbon atoms, an alkoxy group having 12 or less or less carbon atoms, and an aryloxy group having 12 or less carbon atoms. $Z^{31-}$ represents a counter ion that is defined in a similar manner to $Z^{11-}$.

Specific examples of the onium salt that can suitably be used in the present invention include those described in paragraph Nos. [0030] to [0033] of Japanese Patent Application Laid-Open (JP-A) No. 11-310623.

The onium salt used in the present invention preferably has a maximum adsorption wavelength of 400 nm or less, and more preferably 360 nm or less. Thus, by specifying an absorption wavelength within a UV region, the planographic printing plate precursors can be handled under white light.

The amount of the onium salts to be added to a coating solution for an image recording layer, relative to the total solid content of the coating solution, is 0.1 to 50 wt %, preferably 0.5 to 30 wt %, and more preferably 1 to 20 wt %. When the amount of the onium salt to be added is less than 0.1 wt %, sensitivity of the image recording layer decreases, and when the amount of the onium salt to be added to the coating solution is more than 50 wt %, non-image areas are stained during the printing. These onium salts can be used singly, and two or more thereof can be used in combination. These onium salts can be added to the same layer together with other components, or can be added to another layer that is provided separately.

(B) Radically Polymerizable Compounds

Radically polymerizable compounds used in the image recording layer according to the present invention comprise at least one ethylenically unsaturated double bond, and can be selected from a group of the compounds having at least one, preferably two or more terminal ethylenically unsaturated bonds. Such a group of the compounds is widely known in the art, and can be used in the present invention without any restriction. The radically polymerizable compounds have chemical forms such as a monomer, a prepolymer, i.e., dimer, trimer and oligomer, or the mixtures and copolymers thereof. Examples of monomers and the copolymers thereof include unsaturated carboxylic acids (such as an acrylic acid, a methacrylic acid, an itaconic acid, a crotonic acid, an isocrotonic acid, and a maleic acid), and the esters and amides thereof, and preferable examples thereof include esters of unsaturated carboxylic acids and polyvalent aliphatic alcoholic compounds, and amides of unsaturated carboxylic acids and polyvalent aliphatic amine compounds. Further, preferable examples of the radically polymerizable compounds include adducts of unsaturated carboxylic acid esters or amides having a nucleophilic substituent such as a hydroxyl group, an amino group or a mercapto group with monofunctional or multifunctional isocyanates or epoxies; and dehydrated condensates of unsaturated carboxylic acid esters or amides having a nucleophilic substituent such as a hydroxyl group, an amino group or a mercapto group with monofunctional or multifunctional isocyanates or epoxies. Moreover, preferable examples of the radically polymerizable compounds include adducts of unsaturated carboxylic acid esters or amides having an electrophilic substituent such as an isocyanate group or an epoxy group with monofunctional or multifunctional alcohols, amines and thiols. In addition, preferable examples include substituted compounds of unsaturated carboxylic acid esters or amides having an eliminative substituent such as a halogen group or a tosyloxy group with monofunctional or multifunctional alcohols, amines and thiols. Other than the aforementioned examples, a group of the compounds in which the unsaturated carboxylic acid stated above is replaced by an unsaturated phosphonic acid, styrene or the like can be used.

As specific examples of radically polymerizable compounds, the esters of polyvalent aliphatic alcoholic compounds and unsaturated carboxylic acids such as acrylic acid ester, methacryl acid ester, itaconic acid ester, crotonic acid ester, isocrotonic acid ester, and maleic acid ester are disclosed in paragraph Nos. [0037] to [0042] of Japanese Patent Application Laid-Open (JP-A) No. 11-310623, and are applicable to the present invention.

Other examples for suitable use in the invention include esters such as aliphatic alcoholic esters disclosed in Japanese Patent Application Publication (JP-B) Nos. 46-27926 and 51-47334, and Japanese Patent Application Laid-Open (JP-A) No. 57-196231, esters having an aromatic skeleton disclosed in JP-A Nos. 59-5240, 59-5241, and 2-226149, and esters having an amino group disclosed in JP-A No. 1-165613.

Urethane-base addition polymerizable compounds produced by causing an addition reaction between isocyanates and the hydroxy group are also suitable. Specific examples of the urethane-base addition polymerizable compounds include a vinyl urethane compound that contains two or more polymerizable vinyl groups in one molecule, which is produced by adding a vinyl monomer containing a hydroxy group represented by formula (5) shown below to a compound having two or more isocyanate groups in the molecule as disclosed in JP-B No.48-41708, Formula (5)

$$CH_2{=}C(R^{41})COOCH_2CH(R^{42})OH \quad (5)$$

wherein each of $R^{41}$ and $R^{42}$ represents H or $CH_3$.

As for the details of using the radically polymerizable compound, e.g., the type of chemical structure, the use manner such as single use or combination use, the addition amount to the coating solution, or the like can arbitrarily be determined in accordance with a final performance design of the image recording material. For example, such details can be chosen from the standpoint described below. In respect of sensitivity, the chemical structure having a larger number of unsaturated groups in one molecular is preferable. In many cases, the compound having two or more functional groups is preferable. In order to increase strength of the image area, i.e., a cured film, a compound having three or more functional groups is preferable. Further, in view of controlling both sensitivity and strength, it is effective to use various compounds having different numbers of functional groups or different kinds of polymerizable groups (such as acrylate compounds, methacrylate compounds, and styrene compounds) in combination. The compound having a higher molecular weight or the compound with higher hydrophobic property is excellent in sensitivity and film-strength, although unpreferable in respect of development speed or deposition in a developer. Choice or using method of the radically polymerizable compounds is essential in order to obtain compatibility with or dispersibility in other components (such as a binder, an initiator, and a colorant) in the image recording layer. For example, use of a compound with low purity or use of two or more kinds of compounds in combination may increase the compatibility. Moreover, there is a possibility in that a specified structure may be selected in order to improve stickness of a support or an overcoat layer. With respect to the proportion of the radically polymerizable compound in the image recording layer, a larger proportion gives higher sensitivity of the image recording layer. When the proportion of the radically polymerizable compound is excessive, undesirable phase separation occurs, or alternatively, a problem associated with adhesiveness of the image recording layer during the manufacturing process (i.e., poor manufacturing due to transfer or adhesion of the component of the image recording layer) or a problem of the deposition separating out from a developer arises.

In view of the foregoing, the proportion of the radically polymerizable compound relative to the total components of the composition is 5 to 80 wt %, and preferably 20 to 75 wt %. The radically polymerizable compounds can be used singly or in combination of two or more thereof. Besides, when using the radical polymerization component, appropriate structure, proportion, and addition amount can arbitrarily be selected from the standpoints of degree of polymerization hindrance by oxygen, resolution, fog, refractive index variation and surface stickness. In some cases, a layer construction and a coating method to provide an undercoat and an overcoat are implemented.

(C) Light Absorbent

Since the planographic printing plate precursors of the present invention has sensitivity to a UV ray, a visible ray, or an infrared ray to cause image formation, it is preferable to contain a light absorbent in the image recording layer. The light absorbents used in the present invention are the compounds capable of absorbing the UV ray, the visible ray, or the infrared ray, and generating radicals when used in combination with a radical-generating agent.

Examples of initiators that are sensitive to the visible light region include combinations of organic peroxides and chlorophyll; organic peroxides and eosin G; organic peroxides and riboflavin; organic peroxides and Methylene Blue; organic peroxides and (thio)pyrylium salt; organic peroxides and merocyanine; organic peroxides and quinoline; organic peroxides and styrylquinone; organic peroxides and (thio) xanthene dye; organic peroxides and riboflavintetrabutyrate; organic peroxides and (keto)coumarin dye; organic peroxides and N-phenylglycine and (thio)xanthene dye; organic peroxides and (keto)coumarin dye; diphenyliodonium salt and merocyanine dye; diphenyliodonium salt and rhodanine derivative polymer; diphenyliodonium salt and ketocoumarin dye; diphenyliodonium salt and tetraphenylporphyrin; diphenyliodonium salt and tetrabenzoporphyrin dye; diphenyliodonium salt and spiropyran; diphenyliodonium salt and N-phenylglycine and (thio)xanthene dye; diphenyliodonium salt and N-phenylglycine and merocyanine dye; cyanine dye, alkyl borate of cyanine dye, alkyl borate of rhodamine dye, alkyl borate of methylene blue dye, ferro-allene complex, ferro-allene complex and ketocoumarin dye; ferro-allene complex and thioxanthene dye; fluorine-substituted titanocene; bisimidazole and allylideneary1 ketone; bisimidazole and ketocoumarin dye; N-phenylglycine and (thio) xanthene dye; tris(trichloromethyl)-s-triazine derivative and monocyanine dye; tris(trichloromethyl)-s-triazine derivative and ketocoumarin dye; tris(trichloromethyl)-s-triazine derivative and thiopyrilium salt; tris(trichloromethyl)-s-triazine derivative and thioxanthene dye; aminobenzonic acid ester and riboflavintetrabutyrate; and 2-mercaptobenzoimidazole and (thio)pyrylium salt.

Examples of initiators that are sensitive to near-infrared rays include combinations of a near-infrared region absorptive cationic dye salt, a near-infrared region absorptive cationic dye, and ammonium salt; and a near-infrared region absorptive cation dye, a triazine compound, and an ammonium salt.

When images are recorded on the image recording layer of the image recording material according to the present invention by using a laser emitting an infrared ray, it is preferable to add the light absorbent having a function to convert an infrared light used for exposure to heat from the standpoint of improving sensitivity. As such light absorbents, dyes or pigments having a maximum absorption especially in a wavelength region of 760 nm to 1200 nm are preferable. The light absorbent which adsorbs light in an infrared region (infrared ray absorbent) will be described in more detail, hereinafter.

Commercially available dyes, and known dyes described in documents such as “Dye handbook” (published by Organic Synthetic Chemistry Association in 1970) can be utilized. Specific examples of the dyes are disclosed in paragraph Nos. [0050] to [0051] of Japanese Patent Application (Laid-Open) No. 10-39509.

Specifically preferable examples of the dyes include a cyanine dye, a squarylium dye, a pyrylium salt, and a nickel thiolate complex. Further, a cyanine dye is preferable, and the cyanine dye represented by the following formula (6) is most preferable:

(6)

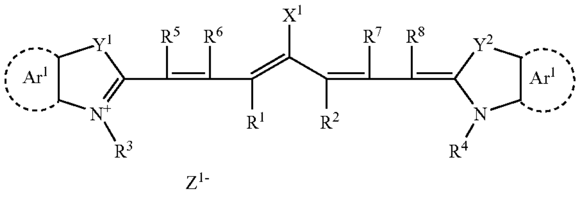

In formula (6), $X^1$ represents a halogen atom, $X^2$-$L^1$ or $NL^2L^3$ wherein $X^2$ represents an oxygen atom or a sulfur atom; $L^1$ represents a hydrocarbon group having 1 to 12 carbon atoms; and each of $L^2$ and $L^3$ independently represents a hydrocarbon group having 1 to 12 carbon atoms; and each of $R^1$ and $R^2$ independently represents a hydrocarbon group having 1 to 12 carbon atoms. From the standpoint of storability of an coating solution for an image recording layer, it is preferable that each of $R^1$ and $R^2$ is a hydrocarbon group having 2 or more carbon atoms. Further, it is particularly preferable that $R^1$ and $R^2$ are bonded to each other to form a 5-membered or 6-membered ring.

$Ar^1$ and $Ar^2$ may be the same or different, and each represents an optionally substituted aromatic hydrocarbon groups. $Y^1$ and $Y^2$ may be the same or different, and each represents a sulfur atom or a dialkylmethylene group having 12 or less carbon atoms. $R^3$ and $R^4$ may be the same or different, and each represents an optionally substituted hydrocarbon group having 20 or less carbon atoms. Preferable examples of substituents include an alkoxy group having 12 or less carbon atoms, a carboxyl group, and a sulfo group. $R^5$, $R^6$, $R^7$ and $R^8$ may be the same or different, and each represents a hydrogen atom or an optionally substituted hydrocarbon group having 12 or less carbon atoms. From the standpoint of availability of a raw material, the substituent is preferably a hydrogen atom. Further, $Z^{1-}$ represents a counter anion. However, when any one of $R^1$ to $R^8$ is substituted by a sulfo group, $Z^{1-}$ is unnecessary. From the standpoint of storability of the coating solution for the image recording layer, preferable examples of $Z^{1-}$ include a halogen ion, a perchlorate ion, a tetrafluoroborate ion, a hexafluorophosphate ion, and a sulfonate ion. A perchlorate ion, a hexafluorophosphate ion, and an aryl sulfonic acid ion are particularly preferable.

Specific examples of the cyanine dye represented by formula (6) that can be suitably applied to the present invention include those disclosed in the paragraph Nos. [0017] to [0019] of JP-A No. 11-310623.

As the pigments used in the present invention, commercially available pigments and those disclosed in color index (C. I.) handbooks, “The Latest Pigments Handbook” (published by Nippon Pigments Technical Association, edited in 1977), “The Latest Pigments Applied Technology” (published by CMC Publisher, edited in 1986), and “Printing Ink Technology” (published by CMC Publisher, edited in 1984) can be used.

Examples of types of pigments include black pigment, yellow pigment, orange pigment, brown pigment, red pigment, violet pigment, blue pigment, green pigment, fluorescent pigment, metal powder pigment, and polymer-coupled dye. Detailed descriptions of these pigments are disclosed in paragraph Nos. [0052] to [0054] of JP-A No. 10-39509, and can also be applied to the present invention. Among these pigments, carbon black is preferable.

The amount of the aforementioned pigments or dyes to be included in the image recording layer, relative to the total solid content of the coating solution for an image recording layer, is preferably 0.01 to 50 wt %, and more preferably 0.1 to 10 wt %. In the case of the dyes, a range of 0.5 to 10 wt % is most preferable, and in the case of the pigments, a range of 1.0 to 10 wt % is most preferable.

When the amount is less than 0.01 wt %, sensitivity of the image recording layer may decrease. When the amount is more than 50 wt %, non-image areas of the image recording layer may be stained when producing the planographic printing plate precursor.

(E) Binder Polymer

In the present invention, it is preferable to further add a binder polymer to the image recording layer in order to improve film performance. It is preferable to use a linear organic polymer as the binder. Any “linear organic polymers” can be used. In order to make development with water or a weak aqueous alkaline solution possible, a linear organic polymer which is soluble in water or a weak aqueous alkaline solution or swellable is chosen. The linear organic polymer can arbitrarily be selected and used not only as the film forming agent for forming the image recording layer but also as the developer in accordance with the purpose of using water, a weak aqueous alkaline solution or an organic solvent. For example, when a water-soluble organic polymer is used, development with water is made possible. Examples of such linear organic polymers include radical polymers having a carboxylic acid group at the side chains thereof, such as those disclosed in Japanese Patent Application (JP-A) Nos. 59-44615, 54-92723, 59-53836, and 59-71048 and Japanese Patent Application Publication (JP-B) Nos. 54-34327, 58-12577, and 54-25957, e.g., a methacrylic acid copolymer, an acrylic acid copolymer, an itaconic acid copolymer, a crotonic acid copolymer, a maleic acid copolymer, a partially esterified maleic acid copolymer and the like. In a similar manner to this, acidic cellulose derivatives having a carboxylic acid group at the side chains thereof can be used. Besides, a compound in which a cyclic acid anhydride has been added to a polymer having a hydroxyl group is useful.

Among these, (meth)acrylic resins having a benzyl group or an allyl group, and a carboxyl group at the side chains thereof are excellent in film strength, sensitivity, and the balance of developing performance, and thus are preferable.

An urethane-base binder polymer containing an acid group as disclosed in JP-B Nos. 7-12004, 7-120041, 7-120042, and 8-12424, and JP-A Nos. 63-287944, 63-287947, 1-271741, and 10-116232, is extremely excellent in strength, and is advantageous in respect of printing-resistance and exposure with low light amount.

Besides, as the water-soluble linear organic polymer, polyvinyl pyrolidone, polyethylene oxide, and the like are useful. Further, in order to increase the strength of cured film, alcohol-soluble nylon or polyethers of 2,2-bis-(4-hydroxyphenyl)-propane and epichlorohydrin are also useful.

The weight average molecular weight of the polymers used in the present invention is preferably 5,000 or more, and more preferably 10,000 to 300,000. The number average molecular weight of the polymers is preferably 1,000 or more, and more preferably ranges from 2,000 to 250,000. Polydispersion degree (weight average molecular weight/number average molecular weight) is preferably 1 or more, and more preferably 1.1 to 10.

Preferable examples of these polymers include a random polymer, a block polymer, a graft polymer, and the like. A random polymer is preferable.

The binder polymers for use in the present invention can be used singly or in combination. The proportion of these polymers added to the image recording layer, relative to the total solid content in the coating solution for the image recording layer, is 20 to 95 wt %, and preferably 30 to 90 wt %. When the amount of polymers added to the image recording layer is less than 20 wt %, strength at the image area is insufficient when forming images. When the amount of the polymers added to the image recording layer is more than 95 wt %, images are not formed. A weight ratio of the compound having the radically polymerizable and ethylenically unsaturated-double bond to the linear organic polymer is preferably ⅕ to ⅔.

Additional Components

In the present invention, other than the aforementioned compounds, various compounds can be added. For example, dyes having large absorption in a visible light region can be used as the colorant for images. Further, pigments such as phthalocyanine pigments, azo pigments, carbon black, and titanium oxide can suitably be used.

It is preferable to add these colorants in order to allow the image areas and the non-image areas to be easily distinguished from one another after images have been formed. The amount of the colorants to be added to the image recording layer, relative to the total solid content of the coating solution for the image recording layer, is preferably 0.01 to 10 wt %.

In the present invention, if the image recording layer is a photo-polymerizable layer, it is desirable to add a thermal polymerization inhibitor to the coating solution during the preparation or the storage thereof in a slight amount sufficient to inhibit unexpected thermal polymerization of the compound having the ethylenically unsaturated double bond which can be radically polymerized. Suitable examples of the thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt. The amount of the thermal polymerization inhibitor to be added relative to a total weight of the composition is preferably about 0.01 to about 5 wt %. In order to prevent polymerization hindrance caused by oxygen, derivatives of higher fatty acid such as behenic acids or behenic acid amides can be added as necessary, and rendered to distribute unevenly on the surface of the image recording layer during the drying process after the coating. The amount of the higher fatty acid derivatives to be added relative to the total composition is preferably about 0.1 to about 10 wt %.

Nonionic surfactants disclosed in JP-A Nos. 62-251740 and 3-208514 and amphoteric surfactants disclosed in JP-A No. 4-13149 can be contained in the coating solution for the image recording layer in the present invention in order to improve processing stability under the development conditions.

Examples of the nonionic surfactants include sorbitan tristearate, sorbitan monopalmitate, sorbitan triolate, stearic acid monoglyceride, polyoxyethylene nonylphenyl ether, and the like.

Specific examples of the amphoteric surfactants include alkyldi(aminoethyl)glycine, alkylpolyaminoethylglycine hydrochloride, 2-alkyl-N-carboxyethyl-N-hydroxyethyl imidazolinium betaine, and N-tetradecyl-N,N-betaine (e.g., "Amogen K" manufactured by Daiichi Kogyo Co., Ltd.).

The proportion of the nonionic surfactants and the amphoteric surfactants contained in a coating solution for an image recording layer is preferably 0.05 to 15 wt %, and more preferably 0.1 to 5 wt %.

A plasticizer is added to the coating solution for an image recording layer according to the present invention as necessary in order to impart flexibility to a coating layer. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate, and the like.

The image recording material of the present invention can be manufactured such that each of the aforementioned components necessary to prepare the coating solution for the image recording layer is dissolved in a solvent, followed by coating on a suitable support. Examples of solvents during this process include ethylenedichloride, cyclohexane, methyl ethyl ketone, methanol, ethanol, propanol, ethylene glycol monomethyl ether, 1-methoxy-2-propanol, 2-methoxy ethyl acetate, 1-methoxy-2-propylacetate, dimethoxy ethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, toluene, water and the like. However, the present invention is not limited thereto. These solvents can be used alone or in admixture. The concentration of the aforementioned components (total solid content including additives) in the solvent is preferably 1 to 50 wt %.

The coated amount of the coating solution for the image recording layer (solid content) obtained after the coating and drying processes depends on the purpose of usage. For the planographic printing plate precursors, generally, the coated amount of the image recording layer on the support is preferably 0.5 to 5.0 $g/m^2$. Various coating methods can be used. Examples of the coating methods include bar-coater coating, rotation coating, spray coating, curtain coating, dip coating, air knife coating, blade coating, roll coating, and the like. As the coated amount decreases, apparent sensitivity of the image recording layer increases, whereas film properties of the image-recording layer to function to record images are impaired.

Support

In the image recording material of the present invention, a support onto which the image recording layer and the back coat layer can be provided by coating is plate-shaped and has dimensional stability. Examples of the support include paper, paper having plastic (e.g., polyethylene, polypropylene, or polystyrene) laminated thereon, metal plate (e.g., aluminum, zinc, or copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal), paper or plastic film having the metal as described above laminated or deposited thereon, or the like. As a preferable support, a polyester film or an aluminum plate can be used.

It is preferable to use an aluminum plate which is light in weight as well as excellent in surface-treatment, workability, and corrosion resistance for use in the image recording material of the present invention. Examples of aluminum materials to fulfill the aforementioned requirements include: JIS 1050, JIS 1100, JIS 1070, Al—Mg alloy, Al—Mn alloy, Al—Mn—Mg alloy, Al—Zr alloy, and Al—Mg—Si alloy.

An aluminum plate can be formed into a planographic printing plate precursor by conducting a surface-treatment such as a surface-roughening treatment, followed by applying the coating solution for the image recording layer on the thus treated surface. As for the roughening surface-treatment, a mechanical surface-roughening treatment, a chemical surface-roughening treatment, and an electrochemical surface-roughening treatment are conducted alone or in combination thereof. Further, preferably, an anodizing treatment is conducted so as to ensure the surface of the aluminum plate unsusceptible to scratches or an additional treatment is conducted in order to increase hydrophilic property.

Description of a surface-treatment of the support will be made hereinafter.

Prior to surface-roughening, the aluminum plate is subjected to degreasing treatment as necessary by using surfactants, organic solvents, or aqueous alkaline solutions in order to remove rolling oil from the plate surface. When using the aqueous alkaline solution, neutralizing treatment by an acidic solution or a desmutting treatment can be conducted.

Then, a so-called graining treatment for surface-roughening of the support is conducted in order to increase adhesiveness between the support and the image recording layer and impart water-retaining property to the non-image area of the image recording layer. As a specific method of the graining treatment, there is mentioned a mechanical graining method using a sandblast or a chemical graining method using an etchant comprising an alkali, an acid or the mixture thereof. Further, conventionally known methods such as an electrochemical graining method, a surface-roughening method in which granular materials are adhered to the supporting material by means of an adhesive or like substance exerting the similar adhesive effect, or a surface-roughening method in which a rugged surface is created by contacting under pressure, a continuous body or a roll having fine irregularities formed thereon, to a support material can be applied.

A plurality of such surface-roughening methods can be conducted in combination, by arbitrarily selecting the order or the repeating times of these methods. Since smut is produced on the surface of the support after having undergone such a surface-roughening or graining treatment as described above, it is generally preferable to conduct, as appropriately, a treatment such as rinsing with water or etching with alkaline so as to remove such smut.

In the case of an aluminum support used in the present invention, the support is usually subjected to anodization for forming an oxide film thereon after having undergone such pre-treatments as described above in order to increase wear resistance, chemical resistance, and water-retaining property.

As an electrolyte for anodizing an aluminum plate, any electrolyte can be used insofar as it can form a porous oxide film. Typically, sulfuric acid, phosphoric acid, oxalic acid, chromic acid or the mixture thereof can be used. The concentration of an electrolyte can arbitrarily be determined by the type thereof. Anodizing conditions vary depending on the electrolyte used and hence cannot be specified as a whole. However, generally, an electrolyte is used under the conditions of a concentration of 1 to 80%, a liquid temperature of 5 to 70° C., a current density of 5 to 60 $A/dm^2$, a voltage of 1 to 100V, and an electrolysis duration of 10 sec to 5 min. The amount of an anodic oxide film is preferably 1.0 $g/m^2$ or more, and more preferably in a range of 2.0 to 6.0 $g/m^2$. When the amount of the anodic oxide coating is less than 1.0 $g/m^2$, printing resistance of the image recording layer is insufficient, and non-image areas of the planographic printing plate are susceptible to scratches, thus resulting in a so-called "stain due to scratch" in which ink is deposited on the scratched portions of the planographic printing plate during printing.

After anodized, the aluminum support described above is subjected to an additional treatment using an organic acid or the salt thereof or provided with an undercoat layer for the image recording layer.

An intermediate layer can be disposed between the support and the image recording layer in order to enhance adhesiveness therebetween. Generally, in order to improve adhesiveness, the intermediate layer comprises, e.g., a diazo resin, and a phosphate compound that is adsorbed, for example, to aluminum. The thickness of the intermediate layer is arbitrarily determined. However, the intermediate layer should be thick enough to conduct a uniform bond-forming reaction with the image recording layer disposed thereon. Ordinarily, the coated amount of the intermediate layer in dry solid weight is preferably about 1 to 100 $mg/m^2$, and more preferably 5 to 40 $mg/m^2$. The proportion of the diazo resin in the intermediate layer is 30 to 100%, and preferably 60 to 100%.

After the support surface was subjected to such treatments or undercoating as described above, the rear surface of the support is provided with a back coat layer mentioned above.

Preferable properties of the support for a planographic printing plate are such that the central line mean roughness of the support is 0.10 to 1.2 μm. When the mean roughness is less than 0.10 μm, adhesiveness between the support and the image recording layer is impaired, thus resulting in noticeable decrease in printing-resistance. When the mean roughness is more than 1.2 μm, images are stained rather worse during the printing. As a color density of the support, a reflective density value is specified in a range of 0.15 to 0.65. In case the color density is less than 0.15 exhibiting a whiter hue, halation occurs excessively when the printing plate is exposed with light, thereby making it difficult to form images. When the color density is more than 0.65 exhibiting a blacker hue, it is hard to find images during the inspection work of the plates on which development has been completed whereby inspection workability is seriously decreased.

The image recording material of the present invention can be manufactured as described above. Images can be recorded with this image recording material by using an infrared laser. A thermal image recording by means of a UV lamp or a thermal head is also possible. In the present invention, it is preferable that the printing plate is exposed with light using a solid-state laser and a semiconductor laser emitting an infrared ray in a wavelength range of 760 nm to 1200 nm. The output of the laser is preferably 100 mW or more, and it is preferable to use a multibeam laser device in order to shorten the exposure time. Further, the exposure time per pixel is preferably less than 20 μsec. Energy irradiated onto the recording material is preferably 10 to 300 $mJ/cm^2$.

After exposure using the infrared laser, the image recording material of the present invention is preferably developed with water or an aqueous alkaline solution.

When using an aqueous alkaline solution as a developer, a conventionally known aqueous alkaline solution can be used as a developer or replenisher for the image recording material of the present invention. Examples of the aqueous alkaline solution include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide, and the like. Further, other examples of the aqueous alkaline solution include organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and the like.

These alkaline agents can be used singly or in combination of two or more thereof.

When images are developed by using an automatic processor, it is known that a large number of planographic printing plate precursors can be processed for a long period of time by additionally charging the same kind of developer or an aqueous solution (replenisher) having higher alkalinity than the existing developer, to thereby obviate exchanging the developer held in the reservoir. Also in the present invention, this replenishing method is preferably applied.

Various surfactants or organic solvents can be added to the developer or replenisher as necessary in order to promote or inhibit developing performance and to increase dispersibility of development residue and ink-adaptability of image areas of the printing plate. Preferable examples of surfactants include anionic, cationic, nonionic and amphoteric surfactants. Preferable examples of organic solvents include benzyl alcohols. Further, polyethylene glycol or the derivatives thereof or polypropyleneglycol or the derivatives thereof can preferably be added. Further, non-reducing sugars such as arabitol, sorbitol or mannitol can also be added.

The developing solution and the replenisher solution may contain a reducing agent such as hydroquinone, resorcin, and the salt of an inorganic acid, e.g., sodium or potassium sulfite and sodium or potassium hydrogensulfite, an organic carboxylic acid, an anti-forming agent and hard-water softening agent.

The printing plate which was subjected to a development processing using the above-described developer and replenisher is post-processed by washing-water, rinsing solutions containing surfactants therein, or desensitizing solution containing gum arabic or starch derivatives therein, and thereafter, is subjected to a post-heating processing which is an essential step in the present invention.

In recent years, in plate-making and printing industries, in order to implement rationalization and standardization of a plate-making operation, an automatic processor for printing-plate materials are widely used. This automatic processor generally comprises a development section, a post-processing section, a device for conveying printing-plate materials, reservoirs containing respective processing solutions therein, and a spray device, and conducts a development processing by spraying respective processing solutions pumped up by a pump from spray nozzles, while printing plates after exposure are horizontally conveyed. Further, lately, there is known a method in which plate materials are immersed in a reservoir containing a processing solution therein, conveyed by guide rollers submerged in the solution, and then processed. In such an automatic development processing, the printing plates can automatically be processed while a replenisher is being supplied to each of the processing solutions depending on the processing amount or the operating duration. Further, the replenisher is additionally supplied automatically by sensing electrical conductivity by means of a sensor.

A so-called disposable processing system can be applied for conducting the development processing by using a substantially unused processing solution.

The image recording material having images formed thereon is then forwarded to a printing step as a planographic printing plate, after having undergone desensitizing processing such as gumming as necessary.

The thus obtained planographic printing plate according to the present invention having images formed thereon by way of predetermined processings is loaded onto an offset printer and used for printing a large number of sheets.

EXAMPLES

With reference to Examples, description of the present invention will be given in more detail hereinafter. The present invention is not limited thereto.

Example 1

Preparation of a Support

An aluminum plate (material: 1050) having a thickness of 0.30 mm was washed with trichloroethylene for degreasing. The surface of the aluminum plate was grained with a nylon brush and a 400-mesh pumice powder suspension, and thoroughly washed with water.

The plate was immersed in a 25% aqueous sodium hydroxide solution for 9 seconds at a temperature of 45° C., subjected to etching, and then washed with water. Further, the plate was immersed in a 2% aqueous $HNO_3$ for 20 seconds and washed with water. During this process, the etched amount of the grained surface of the plate was about 3 g/m$^2$. Then, using a 7% sulfuric acid as an electrolyte, a current density of 15 A/dm$^2$ was applied to perform a D.C. anodization for forming an oxide film having a thickness of 3 g/m$^2$ onto the aluminum plate. The obtained aluminum plate was washed with water and dried, and then coated with a coating solution for an undercoat layer. The obtained aluminum plate was dried for 30 seconds at 80° C. The coating amount of the layer after drying was 10 mg/m$^2$.

Coating Solution for an Undercoat Layer

Compounds described below were admixed to prepare a coating solution for an undercoat layer of the following composition:

| | |
|---|---|
| 2-aminoethylphosphonic acid | 0.2 g |
| copolymer of ethylacrylate and sodium 2-acrylamide-2-methyl-1-propane sulfonate in a molar ratio of 75:15 | 0.3 g |
| methanol | 40 g |
| ion exchanged water | 60 g |

Formation of an Image Recording Layer

The following coating solution for an image recording layer was coated by using a wire bar on a support which had the aforementioned undercoat layer formed thereon, and dried for 45 seconds at a temperature of 120° C. by using a hot-air dryer to thereby form an image recording layer (recording layer). Accordingly, a planographic printing plate precursor [P-1] of Example 1 was obtained. The coating amount of the layer after drying was 1.4 g/$m^2$.

The chemical structure of an infrared ray absorbent used for preparing a coating solution for an image recording layer is shown below: (A coating solution for an image recording layer [P-1])

| | |
|---|---|
| behenic acid [component (D)] | 0.02 g |
| N-allyl stearic acid amide [component (D)] | 0.01 g |
| infrared ray absorbent (IR-1) [component (C]) | 0.08 g |
| onium salt (KO-1) [component (A)] | 0.05 g |
| onium salt (KO-2) [component (A)] | 0.15 g |
| dipentaerythritol hexaacrylate [component (B)] | 0.80 g |
| copolymer of allylmethacrylate and methacrylic acid in a molar ratio of 80:20 [component (E)] (weight average molecular weight: 140,000) | 1.20 g |
| naphthalene sulfonic acid salt of Victoria Pure Blue | 0.04 g |
| p-methoxyphenol | 0.001 g |
| fluorine-containing surfactant (MEGAFACE KF309 manufactured by Dainippon Ink and Chemicals, Inc.) | 0.03 g |
| methyl ethyl ketone | 10 g |
| γ-butyrolactone | 5 g |
| methanol | 7 g |
| 1-methoxy-3-propanol | 5 g |

Evaluation of a Planographic Printing Plate Precursor

A CTP outputting system (manufactured by Fuji Photo Film Co., Ltd.) comprising: a plate-material feeder (SA-L8000), an exposure device (Luxel T-9000CTP), a conveyer (T-9000 Conveyer), an automatic processor (LP-310H), and a stocker (ST-1160) was used. A developer having the following composition was charged into a developer reservoir of the automatic processor, and maintained at a temperature of 30° C. Running water was charged into a second bath of the automatic processor, and a finishing gum solution in which FP-2W (manufactured by Fuji Photo Film Co., Ltd.) had been diluted with water in a ratio of 1:1 was charged into a third bath.

| Developer | |
|---|---|
| sodium sulfite | 0.1 wt % |
| potassium hydroxide | 0.06 wt % |
| potassium carbonate | 0.2 wt % |
| ethylene glycol mononaphthyl ether | 4.8 wt % |
| 4Na salt of EDTA | 0.13 wt % |
| silicone surfactant | 0.01 wt % |
| water | 94.7 wt % |

(IR-1)

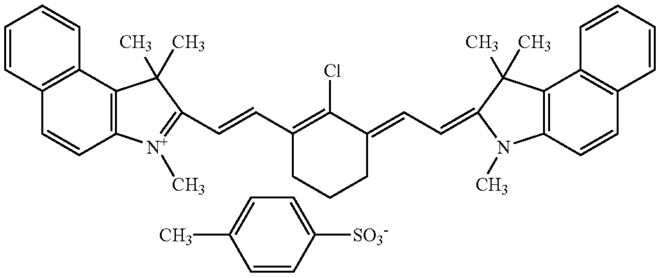

(KO-1)

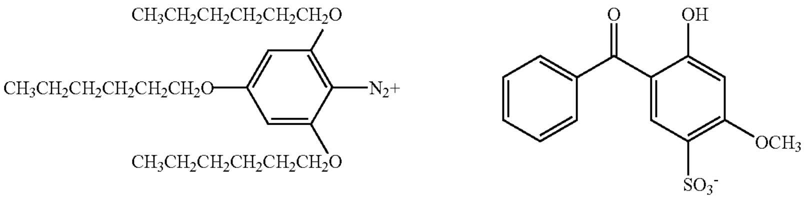

(KO-2)

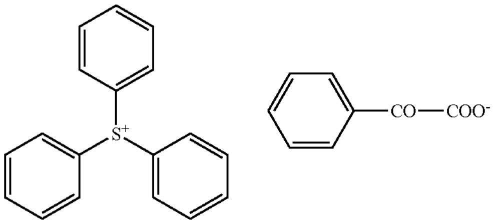

Measurement of a Static Friction Coefficient

A static friction coefficient between the front surface of the image recording layer and the rear surface of the support was measured under the conditions of temperature 80° C. and humidity 50% by using a HEIDEN static frictional angle measuring device (manufactured by Shintoh Kagaku Co., Ltd.). The static friction coefficient was 0.37.

30 sheets of the planographic printing plate precursors [P-1] were loaded onto the plate feeder, and were subjected to an exposure processing and a development processing under a continuous and full-automatic operation, and then discharged to a stocker. During the operation, such an accident as a conveyance failure due to adhesion among the planographic printing plate precursors did not occur. When the images formed on thirty discharged printing-plates were visually observed, to find that no residual layer was produced on an image areas of each of the thirty plates, revealing that high-quality images were formed.

Comparative Example 1

A planographic printing plate precursor [Q-1] was prepared in a similar manner to Example 1 except that a behenic acid in the coating solution for the image recording layer [P-1] and N-allyl stearic acid amide [component (D)] were not used.

The obtained planographic printing plate precursor [Q-1] was evaluated for a static friction coefficient between the front surface of the recording layer and the rear surface of the support in a similar manner to Example 1. The static friction coefficient of [Q-1] was 0.51.

Further, in a similar manner to Example 1, an image was formed on the planographic printing plate precursor [Q-1], and then evaluated. The images formed on thirty (30) discharged printing plates were visually observed to recognize striped residual layers produced on non-image areas of all the plates except one (the first discharged plate), i.e., twenty-nine (29) printing plates.

Example 2

Preparation of a Support

A purification treatment was conducted on a forging of JIS A1050 alloy containing aluminum (99.5% or more), Fe (0.30%), Si (0.10%), Ti (0.02%), and Cu (0.013%) and the obtained forging was cast. During the purification treatment, a degassing treatment was carried out in order to remove unnecessary gas such as hydrogen in the forging, and a ceramic tube filtering treatment was conducted. The casting was a DC casting. The solidified ingot having a plate thickness of 500 mm was faced 10 mm from the surface thereof, and processed with a homogenization treatment for 10 hours at a temperature of 550° C. so as to prevent compounds between the metals from being bulky. The obtained plate was hot-rolled at a temperature of 400° C., and intermediately annealed at a continuous annealing furnace for 60 seconds at a temperature of 500° C., and then cold-rolled to form an aluminum rolled plate having a thickness of 0.30 mm. By regulating the roughness of the rolled roll, the center-line average roughness Ra after having cold-rolled was controlled to 0.2 μm. Thereafter, the obtained plate was leveled by a tension leveler in order to increase the flatness.

A surface-treatment was conducted to form a support of the planographic printing plate.

A 10% aqueous sodium aluminate solution was added to the obtained plate, and then subjected to a degreasing treatment for 30 seconds at 50° C. The plate was neutralized with a 30% aqueous sulfuric acid solution for 30 seconds at 50° C., and then subjected to a smut eliminating treatment.

A so-called graining treatment for surface-roughening of the support was conducted in order to increase adhesiveness between the support and the image recording layer, and to impart water-retaining property to the non-image area of the image recording layer. An aqueous solution containing a nitric acid (1%) and aluminum nitrate (0.5%) was maintained at a temperature of 45° C. While an aluminum web was flown into the aqueous solution, electricity having an alternating waveform at an anode side electric amount 240 $C/dm^2$ and a current density of 20 $A/dm^2$ in a duty ratio of 1:1 was applied to the web from an indirect electric supplying cell to perform an electrolyte graining treatment. Then, an etching treatment was carried out by using a 10% aqueous sodium aluminate solution for 30 seconds at a temperature of 50° C. Then, a neutralizing treatment was conducted using a 30% sulfuric acid solution for 30 seconds at a temperature of 50° C., followed by a smut eliminating treatment.

In order to improve wear-resistance, chemical-resistance, and water-retaining properties, an oxide film was formed on the support by anodization. As an electrolyte for anodization, a 20% aqueous sulfuric acid solution was used at a temperature of 35° C. While the aluminum web was passed through the electrolyte, electrolysis was conducted using a DC of 14 $A/dm^2$ from the indirect supplying cell, whereby an anodic oxide film in an amount of 2.5 $g/m^2$ was formed.

Thereafter, in order to secure hydrophilicity at non-image areas, the printing plate was treated with a silicate. While maintaining a 1.5% aqueous sodium silicate solution No.3 at a temperature of 70° C., the aluminum web was conveyed therethrough to allow contact for 15 seconds, and washed with water. The depositing amount of Si was 10 $mg/m^2$. Ra (central-line average roughness) of the support produced as above was 0.25 μm.

Undercoat Layer

The coating solutions for the undercoat layer described below were applied on this aluminum support using a wire bar, followed by drying for 30 seconds at a temperature of 90° C. using a hot-air dryer. The coating amount of the support after drying was 10 $mg/m^2$.

Coating Solution for an Undercoat Layer

Compounds described below were admixed to prepare a coating solution for the undercoat layer having the following composition:

| | |
|---|---|
| copolymer of methylacrylate and sodium styrene sulfonate in a molar ratio of 75:15 | 0.2 g |
| dibutylnaphthalen sulfonic acid salt of a condensate of 4-diazo-3-methoxydiphenylamine and phenoxyacetic acid and paraformaldehyde | 0.3 g |
| methacryloyloxyethylphosphonic acid | 0.05 g |
| methanol | 40 g |
| ion exchanged water | 60 g |

Formation of an Image Recording Layer

The following coating solution for the recording layer was coated on the support having the aforementioned undercoat layer formed thereon by using a wire bar. The support was dried by a hot-air dryer for 45 seconds at a temperature of 120° C., and an image recording layer was formed, whereby a planographic printing plate precursor [P-2] of Example 2 was obtained. The coating amount after drying was 2.0 $g/m^2$.

The chemical structure of an infrared ray absorbent used for the preparation of a coating solution for the recording layer is shown below.

A copolymer was synthesized from methylacrylate and methacrylic acid and allowed to react with 3,4-epoxycyclohexylmethylmethacrylate to thereby produce a polymer (RP-1), which had a molar ratio of about 40:40:20 and a weight average molecular weight of 100,000.

(A coating solution for an image recording layer [P-2])

| | |
|---|---|
| 1-docosanol [component (D)] | 0.02 g |
| docosanyl acrylate [component (D)] | 0.01 g |
| infrared ray absorbent (IR-2) [component (C)] | 0.06 g |
| onium salt (KO-3) [component (A)] | 0.25 g |
| tris(acryloxyethyl)isocyanurate [component (B)] | 0.40 g |
| polymer (RB-1) [component (E)] | 1.60 g |
| naphthalene sulfonic acid salt of Victoria Pure Blue | 0.04 g |
| polymerization inhibitor (IRGANOX 1010 manufactured by Chiba Specialty Chemicals Co., Ltd.) | 0.005 g |
| polymerization inhibitor | 0.005 g |
| silicone surfactant (TEGO GLIDE 100 manufactured by Tego Chemi. Service Co., Ltd.) | 0.03 g |
| methyl ethyl ketone | 10 g |
| methanol | 7 g |
| 1-methoxy-2-propanol | 5 g |

(IR-2)

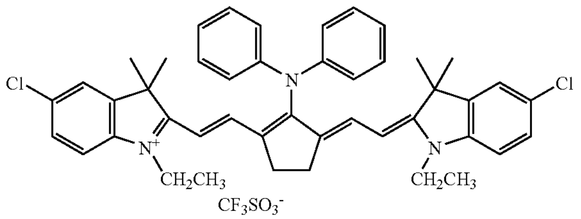

(KO-3)

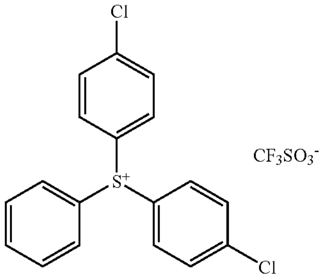

(RB-1)

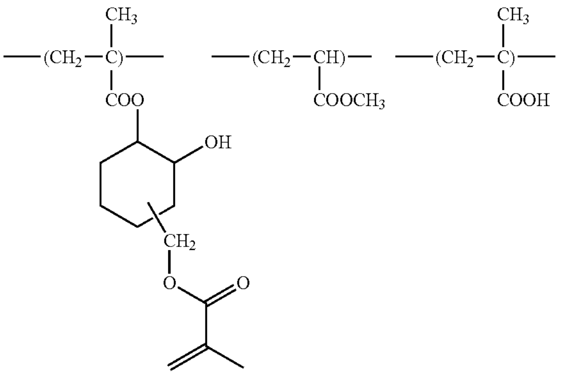

The obtained planographic printing plate precursor [P-2] was assessed for a static friction coefficient between the front surface of the recording layer and the rear surface of the support in a similar manner to Example 1. The static friction coefficient of [P-2] was 0.39.

Further, in a similar manner to Example 1, an image was formed on the planographic printing plate precursor [P-2], and then evaluated. The images formed on thirty (30) discharged printing plates were visually observed. There was no residual layer found at non-image areas of all the thirty printing plates, confirming that high-quality images were obtained.

Comparative Example 2

A planographic printing plate precursor [Q-2] was prepared in a similar manner to Example 1 except that 1-docosanol and docosanyl acrylate [component (D)] in the coating solution for the image recording layer [P-2] were not used.

The obtained planographic printing plate precursor [Q-2] was measured for a static friction coefficient between the front surface of the recording layer and the rear surface of the support in a similar manner to Example 1. The static friction coefficient of [Q-2] was 0.60.

Further, in a similar manner to Example 1, an image was formed on the planographic printing plate precursor [Q-1], and evaluated. The images formed on thirty (30) discharged printing plates were visually observed, to recognize that striped residual layers produced at non-image areas of all the plates except one (the first discharged plate), i.e., twenty-nine (29) printing plates.

Example 3

Preparation of a Support

The following coating solution for an undercoat layer was applied onto the support manufactured in Example 1, followed by drying for 30 seconds in an atmosphere of 80° C. The coating amount after drying was 15 mg/$m^2$.

Coating Solution for an Undercoat Layer

Compounds described below were admixed to prepare a coating solution for an undercoat layer having the following compositions:

| | |
|---|---|
| β-alanine | 0.3 g |
| γ-methacryloyloxytrimethoxysilane | 0.3 g |
| phenyl phosphonate | 0.1 g |
| methanol | 80 g |
| ion exchanged water | 20 g |

Formation of an Image Recording Layer

The following coating solution for an image recording layer was coated by using a wire bar on the support having the aforementioned undercoat layer formed thereon, and dried for 45 seconds at a temperature of 120° C. by using a hot-air dryer, and an image recording layer was formed. Accordingly, a planographic printing plate precursor [P-3] of Example 3 was obtained. The coating amount of the layer after drying was 1.5 g/$m^2$.

The chemical structure of an infrared ray absorbent or the like that was used for the preparation of the image recording layer is shown below:

A copolymer was synthesized from diphenylmethanediisocyanate, hexanemethyleneisocyanate and 2,2-bis (hydroxymethyl)propionic acid and then allowed to react with p-vinylbenzylchloride in the presence of a base to thereby produce a polymer (RP-2), which had a molar ratio of about 20:30:30:20 and a weight average molecular weight of 150,000.

(A Acoating solution for an image recording layer [P-3])

| | |
|---|---|
| reaction product of octadecyl amine and 2-hydroxy-ethylacrylate [component (D)] | 0.02 g |
| dodecylbenzenesulfonic acid phenylester [component (D)] | 0.01 g |
| infrared ray absorbent (IR-3) [component (C)] | 0.08 g |
| onium salt (KO-4) [component (A)] | 0.05 g |
| polyfunctional monomer (TM-1) [component (B)] | 0.08 g |
| polymer (RB-2) [component (E)] | 1.20 g |
| copper phthalocyanine pigment colorant | 0.1 g |
| p-methoxyphenol | 0.001 g |
| fluorine-containing surfactant (MEGAFACE F-475 manufactured by Dainippon Ink and Chemicals, Inc.) | 0.03 g |
| methyl ethyl ketone | 10 g |
| γ-butyrolactone | 5 g |
| methanol | 7 g |
| 1-methoxy-2-propanol | 5 g |

The obtained planographic printing plate precursor [P-3] was evaluated for a static friction coefficient between the front surface of the recording layer and the rear surface of the support in a similar manner to Example 1. The static friction coefficient of [P-3] was 0.47.

Further, in a similar manner to Example 1, an image was formed on the planographic printing plate precursor [P-3], and then evaluated. The images formed on thirty (30) discharged printing plates were visually observed to find that residual layer was not produced at non-image areas of all the thirty printing plates, thereby confirming high-quality images formed.

Comparative Example 3

A planographic printing plate precursor [Q-3] was prepared in a similar manner to Example 1 except that a reaction product of octadecyl amine and 2-hydroxyethy- (IR-3)

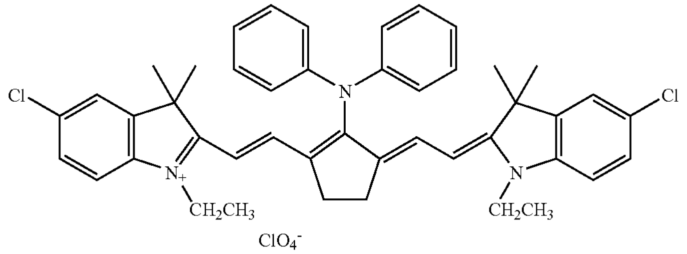

(KO-4)

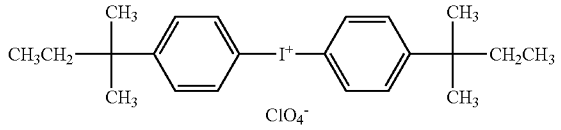

(TM-1)

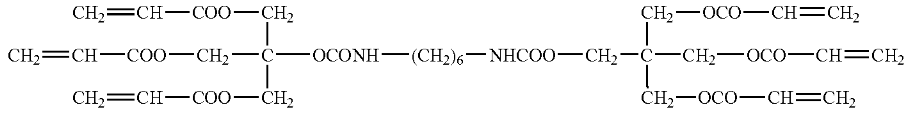

(RB-2)

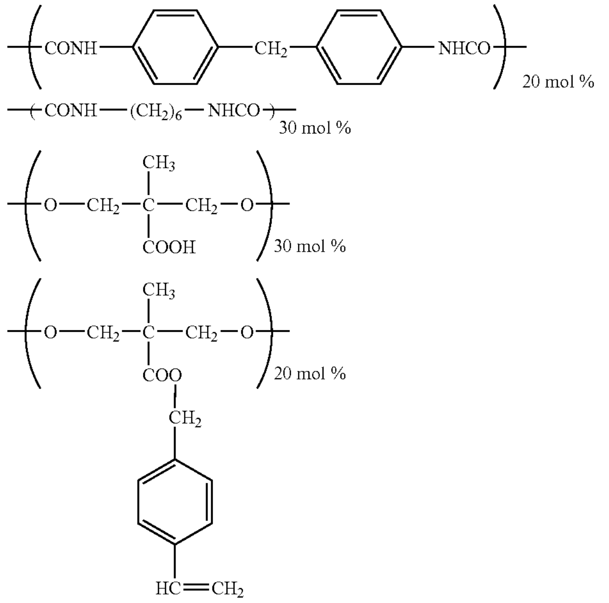

lacrylate and dodecylbenzenesulfonic acid phenylester [component (D)] in the coating solution for an image recording layer [P-3] were not used.

The obtained planographic printing plate precursor [Q-3] was assessed for a static friction coefficient between the front surface of the recording layer and the rear surface of the support in a similar manner to Example 1. The static friction coefficient of [Q-3] was 0.55.

Further, in a similar manner to Example 1, an image was formed on the planographic printing plate precursor [Q-3], and evaluated. The images formed on thirty (30) discharged printing plates were visually observed to find striped residual layers produced at non-image areas of all the plates except one (the first discharged plate), i.e., twenty-nine (29) printing plates.

In accordance with the present invention, there is provided a negative-type image recording material with which images can be recorded directly from digital data from a computer or the like using a solid-state laser and a semiconductor laser emitting an infrared ray. The image recording materials can be stacked and stored without interposing interleaf sheets (protective paper) therebetween. Further, the negative-type image recording material according to the present invention provides an advantage that even when the materials are fed to an image forming device, undesirable residual layer can be prevented from being produced at non-image areas of the image recording layer, thereby forming high-quality images.

What is claimed is:

1. A negative-type image recording material comprising:

a support having a rear surface; and an image recording layer disposed on the support, having a front surface, and including (A) a radical-generating agent, (B) a radically polymerizable compound, and (D) a compound represented by the following formula (1):

$$R^1\text{-}X \quad (1)$$

wherein $R^1$ represents an optionally substituted hydrocarbon group having a total of 8 to 32 carbon atoms; and X represents CO—Y—$R^2$, Y—CO—$R^2$, NH—CO—Y—$R^2$, O—CO—NH—$R^2$, NH—CO—NH—$R^2$, $SO_2$—Y—$R^2$, Y—$SO_2$—$R^2$, O—$SO_2$—$R^2$, CO—O—CO—$R^2$, or Y—$R^3$ in which Y represents O, S, $NR^4$ or a single bond, but if X is Y—$R^3$, then Y is not a single bond, and $R^2$, $R^3$ and $R^4$ each independently represent a hydrogen atom or an optionally substituted hydrocarbon group having a total of not more than 20 carbon atoms, wherein the compound (D) has a radically polymerizable functional group and wherein said image recording layer further comprises a (C) light absorbent which is a dye or pigment having maximum absorption at a wavelength from 760 to 1200 nm.

2. The negative-type image recording material according to claim 1, wherein said (A) radical-generating agent is an onium salt selected from the group consisting of iodonium salts, diazonium salts, and sulfonium salts.

3. The negative-type image recording material according to claim 1, wherein said (B) radically polymerizable compound is a radically polymerizable compound having at least one ethylenically unsaturated double bond.

4. The negative-type image recording material according to claim 1, wherein said image recording layer further comprises a binder polymer.

5. The negative-type image recording material according to claim 2, wherein said onium salt has a maximum absorption at a wavelength of 400 nm or less.

6. The negative-type image recording material according to claim 2, wherein said onium salt is contained in an amount of 0.1 to 50 wt % with respect to total solid content of a coating solution for the image recording layer.

7. The negative-type image recording material according to claim 1 wherein, if the front surface of a portion of the image recording material is in contact with the rear surface of a portion of the image recording material, a static friction coefficient between the front surface and the rear surface is less than 0.50.

8. A negative-type image recording material comprising:

a support having a rear surface; and an image recording layer disposed on the support, having a front surface, and including (A) a radical-generating agent, (B) a radically polymerizable compound, and (D) a compound represented by the following formula (1):

$$R^1\text{-}X \quad (1)$$

wherein $R^1$ represents an optionally substituted hydrocarbon group having a total of 8 to 32 carbon atoms; and X represents CO—Y—$R^2$, Y—CO—$R^2$, NH—CO—Y—$R^2$, O—CO—NH—$R^2$, NH—CO—NH—$R^2$, $SO^2$—Y—$R^2$, Y—$SO_2$—$R^2$, O—$SO_2$—$R^2$, CO—O—CO—$R^2$, or Y—$R^3$ in which Y represents O, S, $NR^4$ or a single bond, but if X is Y—$R^3$, then Y is not a single bond, and $R^2$, $R^3$ and $R^4$ each independently represent a hydrogen atom or an optionally substituted hydrocarbon group having a total of not more than 20 carbon atoms, wherein the compound (D) has a radically polymerizable functional group, and the presence of compound (D) makes a static friction coefficient between the front surface and the rear surface less than 0.50.

9. The negative-type image recording material of claim 1, wherein $R^1$ represents a linear alkyl group, a branched alkyl group or an aryl group.

* * * * *